United States Patent [19]

Yariv et al.

[11] 4,433,291
[45] Feb. 21, 1984

[54] OPTICAL FIBER FOR MAGNETOSTRICTIVE RESPONSIVE DETECTION OF MAGNETIC FIELDS

[75] Inventors: Amnon Yariv, San Marino, Calif.; Harry V. Winsor, Arlington, Va.

[73] Assignee: The United States of America as represented by the Secretary of the Navy, Washington, D.C.

[21] Appl. No.: 223,635

[22] Filed: Jan. 9, 1981

[51] Int. Cl.³ ................... G01R 33/02; G02B 5/14
[52] U.S. Cl. ......................... 324/244; 324/260; 350/96.29
[58] Field of Search .......... 324/244, 86, 260, 225; 350/96.24, 96.29, 96.30, 96.31; 332/7.51

[56] References Cited

U.S. PATENT DOCUMENTS

| | | | |
|---|---|---|---|
| 2,474,693 | 6/1949 | Rowe | 324/244 |
| 3,257,608 | 6/1966 | Bell et al. | 324/0.5 |
| 3,413,572 | 11/1968 | Burklund | 332/26 |
| 3,488,587 | 1/1970 | Sparrow | 324/96 |
| 3,621,390 | 11/1971 | Von Willisen | 324/96 |
| 3,645,603 | 2/1972 | Smith | 350/96.29 |
| 3,659,915 | 5/1972 | Mauer et al. | 350/96 |
| 3,936,742 | 2/1976 | Krause | 324/96 |
| 4,147,979 | 4/1979 | Baues et al. | 324/244 |
| 4,376,248 | 3/1983 | Giallarenzi et al. | 324/96 |
| 4,378,497 | 3/1983 | Giallorenzi | 324/96 |

*Primary Examiner*—Gerard R. Strecker
*Assistant Examiner*—Walter E. Snow
*Attorney, Agent, or Firm*—Robert F. Beers; Frederick A. Wein

[57] ABSTRACT

An optical fiber cable and magnetic field detector magnetostrictively reactive to the presence of an external magnetic field is presented, and methods thereof. The optical fiber cable comprises a elongated optically transparent core sheathed by a magnetostrictively responsive jacket disposed about the periphery of the core. The jacket responds to magnetic fields present and strains the core effecting the light transmission of the core. The effect upon the light transmission by the jacket is detected by interferometry for determining the presence of the magnetic field.

18 Claims, 4 Drawing Figures

OPTICAL FIBER FOR MAGNETOSTRICTIVE RESPONSIVE DETECTION OF MAGNETIC FIELDS

BACKGROUND OF THE INVENTION

The present invention relates to magnetostrictive devices effected by magnetic fields, and more particularly, to magnetostrictive optical fiber cables and magnetic field detectors.

Magnetic field measuring devices, including magnetometers, are well known and include moving and stationary coils, Hall effect devices, thin films, fluxgates, magnetic resonance devices, and superconducting devices. However, the need exists for a low cost device having high sensitivity. The most recent advance in magnetic field detection devices such as SQUID (Superconducting Qllantum Interference Device) devices require cryogenic temperatures for operation and thus have an accompanying high cost of materials and complex apparatus requirements.

Prior art optical devices for detecting magnetic fields make use of the Faraday effect which is based on the measurements of the extent of rotation of circularly polarized light dependent upon the prevailing magnetic field. Devices using the Faraday effect are exemplified in the U.S. Pat. Nos. 3,936,742 of Krause, 3,621,390 of Von Willisen, and 3,257,608 of Bell et al. The Faraday effect devices have low sensitivity and consequently have a poor signal to noise (S/N) ratio. Accordingly, it is desirable to provide a magnetic field detector which is low cost, simple to construct, does not require costly and cumbersome apparatus, can be used at room temperatures, and provides a very high sensitivity to weak magnetic fields and thus a correspondingly high signal to noise ratio.

SUMMARY OF THE INVENTION

The present invention relates to an optical fiber cable for detecting magnetic fields. An elongated core or fiber having optical properties for transmission of light either in a conduit or a waveguide mode is strain coupled to a magnetostrictive material disposed in physical engagement with the core. In the exemplary embodiment, a jacket comprised of magnetostrictive material sensitive and reactive to the presence of magnetic field is sheathed about an optical fiber. In the presence of the magnetic field the magnetostrictive jacket exhibits a magnetostrictive effect which causes a strain in the core or fiber thereby changing the cross sectional diameter of the fiber, the length of the fiber, and the refractive index of the core material. Light entering the fiber in one longitudinal end is effected by the resulting change of refractive index and dimension of the fiber thus changing the phase or mode properties of the light exiting the other end of the fiber.

The presence and strength of the detected magnetic field can be determined by standard interferometry techniques by comparing the phase or mode properties of the light from a light source exiting the fiber having a magnetostrictive jacket against the phase or mode properties of light from the light source exiting a reference fiber having predetermined or identical light transmission properties which are either uneffected by the magnetic field or appropriately effected by the magnetic field to serve the desired measurement function such as a differential measurement between magnetic fields. The sensitivity of magnetic effect upon the magnetostrictively effected fiber can be enhanced by subjecting the magnetostrictive material to a quantitative low level magnetic field.

Thus, the present invention exhibits a very high sensitivity to low level magnetic fields, is considerably more sensitive than Faraday effect devices, and does not require high cost materials or the complicated, bulky, and expensive apparatus for maintaining the detection device at cryogenic temperatures as is required for SQUID devices.

OBJECTS OF THE INVENTION

Accordingly, with reference to the background of invention herein above, it is an object of the present invention to provide an optical fiber having transmission properties which are effected by the magnetic fields, the degree of effect being indicative of the strength of the magnetic field.

It is another object of the present invention to provide an apparatus and method therefor detecting magnetic fields by interferometry.

Still another object of the present invention is to provide a magnetic detector having high sensitivity.

Yet another object of the present invention is to provide means for enhancing the sensitivity of a magnetostrictive magnetic field detector.

A further object of the present invention is to provide a detector of low level magnetic fields which is simple, inexpensive, does not require expensive materials and bulky equipment, and has greatly improved sensitivity over systems of the prior art.

Further objects and advantages of the present invention will become apparent as the following description proceeds and features of novelty characterizing the invention will be pointed out with particularity in the claims annexed to and forming a part of this specification.

DESCRIPTION OF THE DRAWINGS

For a better understanding of the present invention reference may be had to the accompanying drawings wherein.

DETAILED DESCRIPTION OF THE PREFERRED EMBODIMENT

Figure 1:
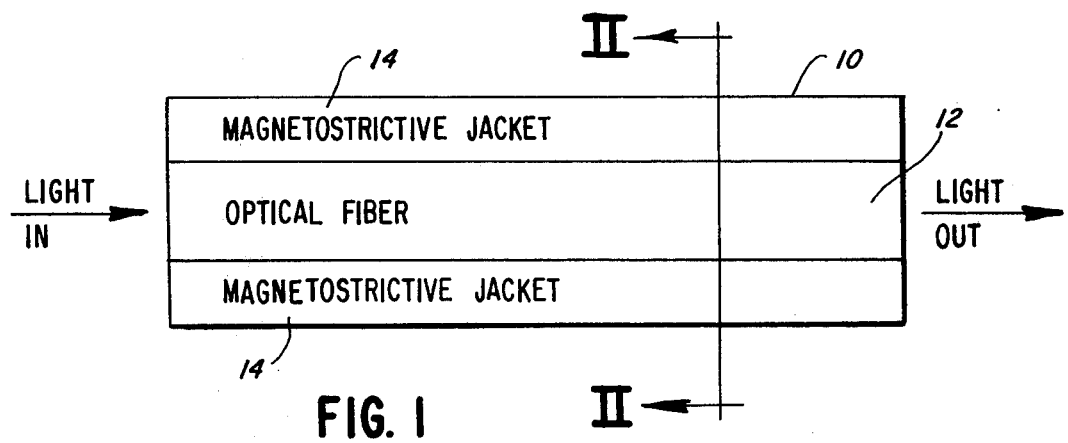
FIG. 1 is a representation of a short section of an optical fiber cable including a magnetostrictive jacket sheathed about an optically transmissive core.
Figure 2:
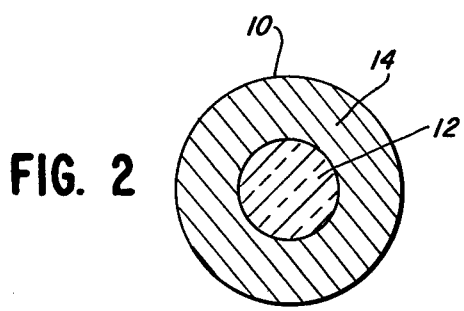
FIG. 2 is a cross-sectional representation of the optical fiber cable of FIG. 1 taken approximately along line II—II.

Referring now to the drawings wherein like reference numerals have been applied to like members, there is shown in FIG. 1 a representation of a magnetostrictive optical fiber cable 10 having a centrally disposed optical fiber or core 12 and a magnetostrictive jacket or cladding 14 sheathed about the core 12. In the present embodiment core 12 is embedded within the jacket 14 and jacket 14 intimately encloses the core 12 about the periphery of core 12 and substantially along the length of the longitudinal axis thereof. The optical fiber cable 10 can be any length desired. The desired length will be determined in consideration of light transmission properties, magnetic sensitivity, and measured functions. A cross-sectional view of optical fiber cable 10 is shown in FIG. 2.

It has been found that magnetostrictive optical devices of the present invention have a sensitivity to magnetic fields of many orders of magnitude weaker than a comparable Faraday effect detector, typically approximately $1.4 \times 10^7$ greater sensitivity for a kilometer of cable. Additionally, the optical cable 10 has a sensitivity to magnetic fields equal to or greater than that of the SQUID devices without the cryogenic apparatus and a refrigeration system for maintaining the liquid helium at the required cryogenic temperatures for a SQUID device.

When the magnetostrictive jacket 14 is immersed in a magnetic field, depending upon the chosen magnetostrictive material, the magnetostrictive material will change dimension in response to the immersing magnetic field. For an optical fiber cable having no built in strain, a jacket of magnetostrictive material such as nickel having a negative magnetostriction coefficient strains the light transmitting fiber, typically made of silica or other appropriate glass, in a compressive manner in response to a magnetic field thereby changing the refractive index of the optical fiber. On the other hand, if an optical fiber cable is produced with a built-in steady state strain and the magnetostrictive jacket is made of a material such as 68 permalloy which has a positive magnetostrictive, then the strain within the optical fiber will be reduced causing a comparable change in the refractive index of the optical fiber. However, other arrangements can be used to utilize both positive or negative magnetostrictive materials.

Additionally, in a like manner, the strain induced in the optical fiber by the magnetostrictive jacket can elongate the optical fiber depending upon the opto-elastic properties of the material of the optical fiber, or in such a case, the phase change effect upon the light is caused by the increased or decreased length of the optical fiber cable. In most cases the magnetostrictive effect on the transmitted light is a combination of both a change in the refractive index of the core and a change in the length of the cable although the percentage contribution from each effect made will be different in different applications. It is understood, for the purposes of this disclosure, that the term "strain" includes both positive and negative strain as shown above.

In the exemplary embodiment, the magnetostrictive jacket 14 exerts the strain about the periphery of the optical fiber cable 10 and substantially along the length of the cable 10. The magnetostrictive jacket 14 is comprised of nickel for negative magnetostriction and 68 permalloy for positive magnetostriction, such materials having been found to have a large magnetostrictive effect to a magnetic field. The magnetostrictive jacket material can be put on to the fiber in a plurality of ways which include dipping, vacuum plating sheathing, or electroless plating. In the exemplary embodiment, nickel was used in a plating process. A plating of less than 1 micron is sufficient for magnetic field detection, however, a thicker coating is desirable, such as a coating of approximately ⅓ the diameter of the optical fiber, for providing optimum sensitivity. The optimum sensitivity can be achieved when the magnetostrictive material and the fiber core contribute about equally to the elastic compliance of the cable. Dipping would provide a more acceptable method for depositing a magnetostrictive material to form a magnetostrictive jacket upon an optical fiber having a relatively large diameter if a thick coating is desired. For optical fibers of sufficiently small diameter, electroless and vacuum plating are sufficient.

Figure 3:
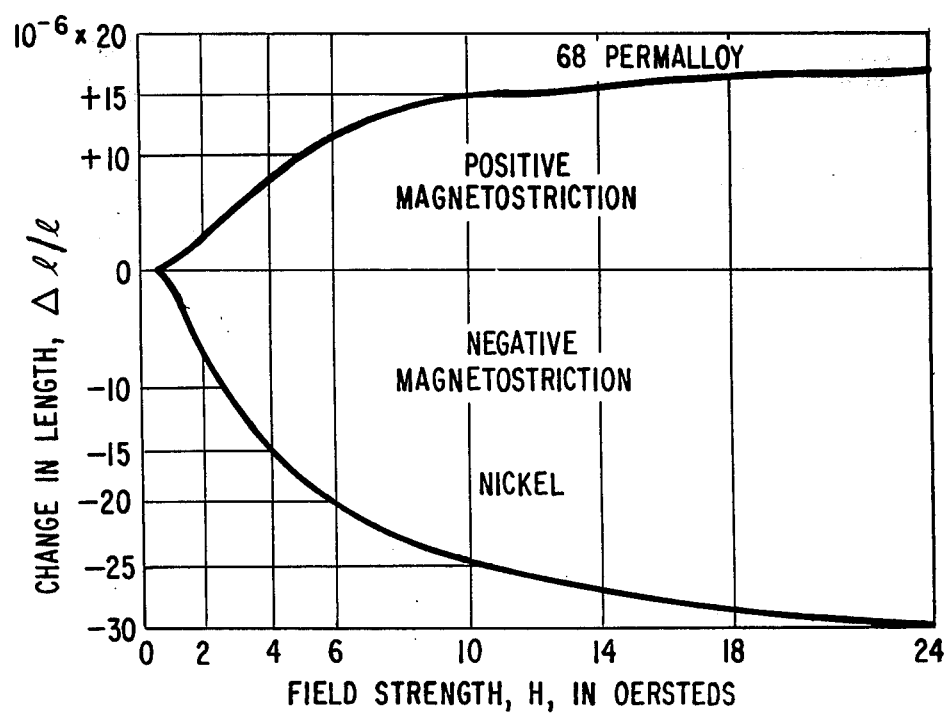
FIG. 3 is a graphic illustration showing magnetostrictive changes in length with respect to magnetic field strength for two magnetic substances.

Referring now to FIG. 3, there is shown a graph for a magnetostrictive effect of nickel and 68 permalloy in the presence of a magnetic field. This graph is derived from the book entitled "Ferromagnetism" F. M. Bozorth, Van Nostrand, 1951 and shows the change in length, $\Delta l/l$ vs. the magnetic field strength in Oersteds.

The total phase change of light propagating in the fiber is primarily the phase change in the length L of the fiber. Using data for fused quartz, the phase change is calculatable from the equation:

$$\Delta\phi = \frac{2\pi nL}{\lambda} 0.92\epsilon$$

where $\epsilon$ is the strain in an isotropic medium due merely to the change of magnitude of the priciple dielectric axis.

The strain $\epsilon$ along the longitudinal axis of the fiber is related to the magnetic field H to be detected by the equation:

$$\Delta\phi(\text{rad}) = -2.44 \times 10^{-5}(L/\lambda)H$$

where H is in Gauss. According to these equations, to detect a field of $H = 10^{-5}$ Gauss, the phase shift is approximately 14° if $L = 10^3$ m (1 km).

In comparison, the rotation of polarized light in the presence of magnetic fields by Faraday rotation is due to paramagnetic impurities within the glass. The amount of Faraday rotation is given by $\theta = VHL$ where V is the Verdet constant, L is the length of the fiber, and H is the magnetic field. The maximum useful length of fiber is $\sim \alpha^{-1}$, where $\alpha$ is the absorption coefficient at the wavelength of the light used. Thus, the maximum Faraday rotation is then $\theta_{max} \simeq VH/\alpha$, which for a typical good glass is $\sim 6$ minutes/G. By way of comparison, the magnetostrictive effect yields $2.44 \times 10^4$ rad in 1 km of fiber. Thus, it is seen that Faraday rotation is a considerably smaller effect.

Figure 4:
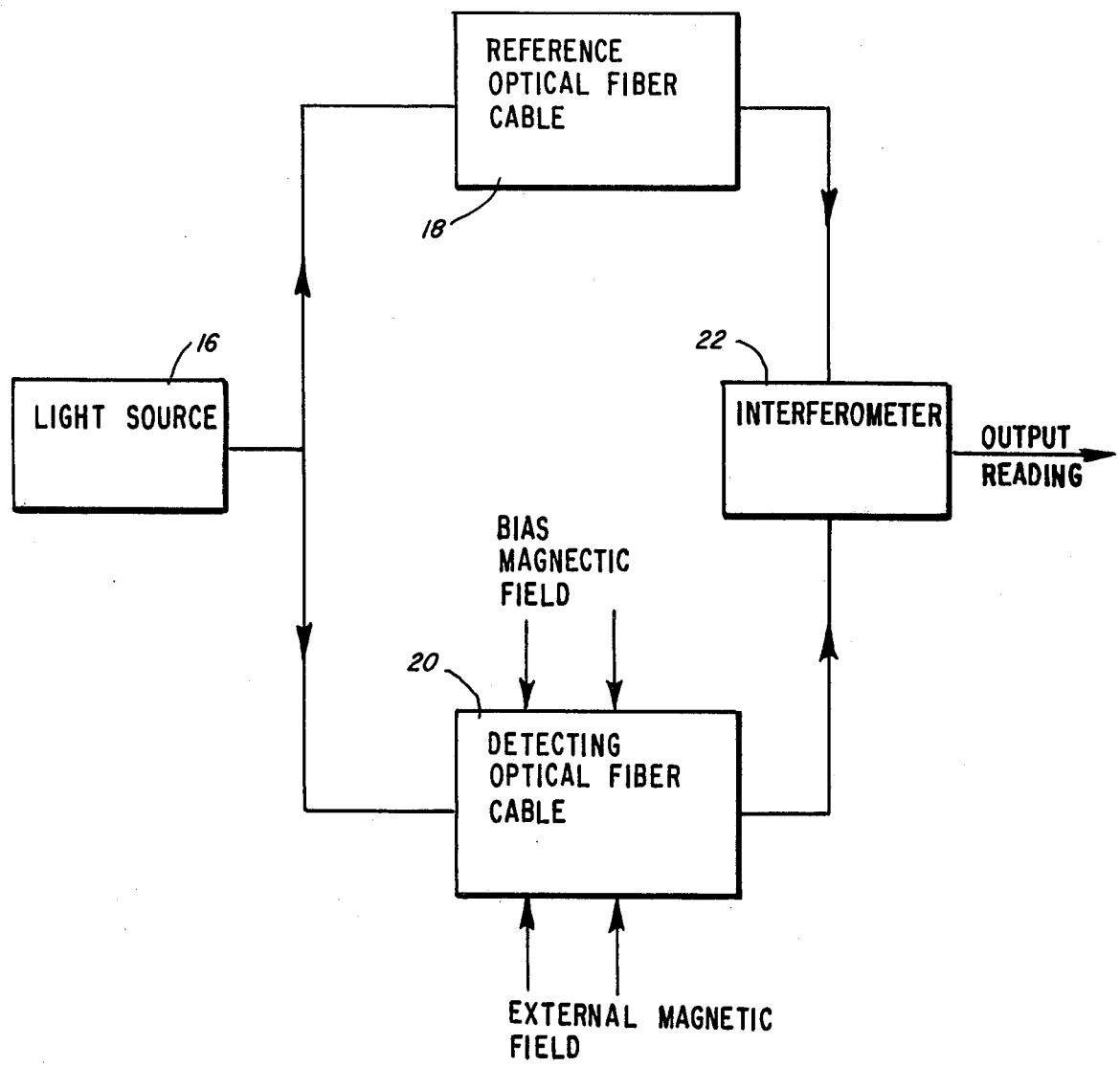
FIG. 4 is a block diagram representation of a system for detecting and measuring the presence of a magnetic field.

Referring now to FIG. 4, a convenient detection scheme used in the exemplary embodiment is to mix a light beam from the output of the magnetostrictive fiber with that of a beam of light derived from the same light source but exiting a reference fiber which is not sensitive to a magnetic field, and comparing the two light beams in an interferometric system. A light source 16 need not be polarized or phase coherent, although the results can be more easily derived when a laser is used. When a laser is used, a laser diode is sufficient to serve the purpose. A light from the light source is then fed to reference optical fiber 18 and the magnetic field detecting optical fiber 20 having a magnetostrictive effect on the light transmission as described above. The outputs of the optical fibers 18, 20 are then fed to an interferometer 22 for measuring a phase difference between the outputs of the respective optical fibers. The optical fibers need not be single mode optical waveguides, however, single mode optical waveguides are convenient for a coherent light source. Thus, the interferometer used depends upon the chosen light source and the optical fibers used.

For example, if the phase delay at the detector of the output from the fibers is $\pi/2$ (this constant phase delay can be maintained by a separate feedback loop) then the signal output current from the mixing detector of the interferometer will be $$i_s \simeq \frac{Pe\eta}{h\nu} \Delta\phi \simeq \frac{Pe\eta}{h\nu} 2.44 \times 10^1 LH$$

where P is the total power in the optical beam, e is the electron charge and $\eta$ is the quantum efficiency of the detector. If the magnetic field is time varying, this time dependence will be imparted to the current i and appropriate magnetostrictive coefficients should be used.

Thus, the optical fiber cable having magnetostrictive effects senses the external magnetic field by effecting the propagation of light in the optical fiber, elsewhere herein referred to as light transmission of the optical fiber. The referenced optical fiber 18 should be substantially similar to the detecting fiber 20 with or without the magnetostrictive effect. The detecting optical fiber 20 and the reference optical fiber 18 having respective outputs fed to the interferometer 22 comprises a convenient detection scheme for detecting the external magnetic field. Other comparative for interferometric means can be used than that shown in the exemplary embodiment. It is also within contemplation of the present invention that data be taken of the light transmission characteristics of the detecting optical fiber 20 independent of an external magnetic field and such light transmission characteristics be recorded. The light transmission characteristics of the detecting optical fiber 20 when in the presence of an external magnetic field are then compared against the previously recorded characteristics for detecting the presence of the external magnetic field without the necessity of a second reference optical fiber.

Additionally, the quantity of magnetostrictive effect is directly correlatable according to the equation to the strength of the external magnetic field being detected. Accordingly the output reading of the interferometer can be calibrated for determining the quantity of the magnetic field.

Referring again to FIG. 3, it is shown that the slope of the curve of magnetostrictive effect changes with magnetic field strength. For example, proximate to the zero magnetic field strength and zero change in length, the slope of the curve for the nickel is substantially steeper than the slope for higher magnetic field strength, e.g. 18 Oersteds. Thus, the sensitivity of the magnetostrictive material can be biased to the point of maximum sensitivity by a constant biasing magnetic field as shown in FIG. 4. As can be seen from FIG. 3, the optimum sensitivity for nickel takes place for a field strength of approximately 3 Oersteds. Such a low bias field can be provided by coiling a current-carrying wire along the fiber or by placing a coiled fiber in a weak electromagnetic or permanent magnet. It should be noted that the field strength of the earth's magnetic field is approximately 0.6 Gauss or Oersteds with a horizontal component of 0.2 Gauss or Oersteds. In certain cases the bias magnetic field can be provided by the earth's magnetic field.

There are instances, such as in a magnetically noisy environment, where maximum sensitivity of the magnetic field detector would result in unsteady and unreliable readings. In such an event, the sensitivity of the detector can be adjustably reduced by varying the bias magnetic field along the curve of FIG. 3 to a desired decreased sensitivity. This can be accomplished by an increase of the bias field to a point on the magnetostrictive curve of FIG. 3 having a less steep more horizontal slope. If the bias field is provided by an electromagnet or a current carrying coil, then the current through the coil or electromagnet can be increased for increasing the bias magnet field and thereby reduce the sensitivity of the magnetic field detector. Thus it is shown that the magnetic field detector can be of variable sensitivity which is precisely controllable for increased or decreased sensitivity according to the particular test requirements, and that the stability and reliability of the quantitative measurement of the magnetic field can be improved by an appropriate adjustable reduction of the sensitivity of the magnetic field detector.

Thus, there is disclosed an optical transmission line and magnetic field detector magnetostrictively reactive to the presence of an external magnetic field. The optical transmission line comprises an optically transparent transmission means, typically silica, which is effected by a magnetostrictive material responsive to an external magnetic field. In the exemplary embodiment, a magnetostrictive jacket is used to strain the core in response to a magnetic field. The effected light transmission is then compared against a referenced optical fiber cable without magnetostrictive effect by a detection means, typically an interferometer, for detecting the presence of an external magnetic field and measuring the quantity of the external magnetic field.

While there has been illustrated and described what is at present considered to be a preferred embodiment of the present invention, it will be appreciated that numerous changes and modifications are likely to occur to those skilled in the art and it is intended in the appended claims to cover all those changes and modifications which fall within the true spirit and scope of the present invention.

What is claimed as new and desired to be secured by Letters Patent is:

1. An optical fiber comprising:
    a light transmission means for transmission of light therethrough, and
    a magnetostrictive means magnetostrictively responsive to a magnetic field circumpositionally and superjacently covering the light transmission means about the cross-section of the light transmission means and along a length of the light transmission means for changing the optical path length of the light transmission means along the length of the light transmission means in response to the magnetic field.

2. An optical fiber comprising:
    a light transmission means for transmission of light therethrough, the transmission of the light being effectable by strain, and
    a magnetostrictive means magnetostrictively responsive to a magnetic field circumpositionally and superjacently covering the light transmission means about the cross-section of the light transmission means and along a length of the light transmission means for changin the optical path length of the light transmission means along the physical length of the light transmission means in response to the magnetic field.

3. The optical fiber of claims 1 or 2, wherein the light transmission means comprises an optical fiber core and the magnetostrictive means comprises a jacket sheathed about the periphery of the core.

4. The optical fiber of claim 3 wherein the core has length along a longitudinal axis, and the light is conducted along the longitudinal axis.

5. The optical fiber of claim 4 wherein the jacket is a cladding comprised of a nickel substance.

6. The optical fiber of claim 5 wherein the cladding is optically opaque.

7. A detector for detecting the presence of a magnetic field comprising:
   a light transmission means for transmission of light therethrough,
   a magnetostrictive means magnetostrictively responsive to a magnetic field circumpositionally and superjacently covering the light transmission means about the cross-section of the light transmission means and along a length of the light transmission means for changing the optical path length of the light transmission means along the physical length of the light transmission means in response to the magnetic field, and
   a means sensitive to the effect upon the light transmission of the light transmission means in response to the magnetic field for determining the presence of the magnetic field.

8. The detector of claim 7 further comprising a second light transmission means and a means for comparing the light conducted by the light transmission means with the light conducted by the second light transmission means.

9. The detector of claim 8 wherein the light transmission means comprises an optical fiber core and the magnetostrictive means comprises a jacket sheathed about the periphery of the core.

10. The devices of claims 1,2,7,8 or 9 further comprising sensitivity increasing means comprising a bias magnetic field magnetically coupled to the magnetostrictive means for enhancing the magnetostrictive reaction of the magnetostrictive means to the applied magnetic field.

11. The device of claim 3 wherein the core is embedded within the magnetostrictive means.

12. A method for detecting the presence of a magnetic field comprising the steps of:
   providing a first optical fiber having a first light transmission means, and a magnetostrictive means magnetostrictively responsive to a magnetic field circumpositionally and superjacently covering the first light transmission means about the cross-section of the first light transmission means and along a length of the first light transmission means for changing the optical path length of the light transmission means along the physical length of the first light transmission means in response to the magnetic field,
   providing a second optical fiber having a second light transmission means,
   transmitting light through the first and the second light transmission means, and
   comparing of the light transmission of the first light transmission means with the light transmission of the second light transmission means during exposure of the first optical fiber to the magnetic field, a difference between the light transmission of the first light transmission means and the second light transmission means due to exposure of the first optical fiber to the magnetic field comprising a detecting of the presence of the magnetic field.

13. A detector for detecting the presence of a magnetic field comprising:
   a light transmission means for conducting light therethrough,
   magnetostrictive means magnetostrictively responsive to the magnetic field circumpositionally and superjacently covering the light transmission means about the cross-section of the light transmission means and along a length of the light transmission means for changing the optical path length of the light transmission means along the physical length of the light transmission means in response to the magnetic field,
   a means sensitive to the effect on the light transmission of the light transmission means in response to the applied magnetic field for determining the presence of the magnetic field, and
   sensitivity adjusting means comprising a bias magnetic field magnetically coupled to the magnetostrictive means for controllably adjusting the sensitivity of the magnetostrictive means to the magnetic field.

14. The detector of claim 13 wherein the sensitivity of the magnetostrictive means is enhanceable by the bias magnetic field.

15. A method of controllably adjusting the sensitivity of a magnetic field detector comprising the steps of:
   providing the magnetic field detector having a magnetostrictive means magnetostrictively responsive to the magnetic field circumpositionally and superjacently covering a light transmission means about the cross-section of the light transmission means and along a length of the light transmission means for changing the optical path length of the light transmission means along the physical length of the light transmission means in response to the magnetic field,
   providing a bias magnetic field coupled to the magnetostrictive means for biasing the magnetostrictive means to a desired magnetostrictively responsive sensitivity, and
   adjusting the bias magnetic field to achieve the desired sensitivity.

16. An apparatus for measurement of a magnetic field comprising:
   a light transmission means for transmission of light therethrough,
   a magnetostrictive means magnetostrictively responsive to the magnetic field circumpositionally and superjacently covering the light transmission means about the cross-section of the light transmission means and along a length of the light transmission means for changing the optical path length of the light transmission means along the physical length of the light transmission means in response to the magnetic field, and
   a means quantitatively sensitive to the effect on the light transmission of the light transmission means in response to the magnetic field for quantitatively measuring the magnetic field.

17. An apparatus for measurement of a magnetic field comprising:
   a light transmission means for conducting light therethrough,
   magnetostrictive means magnetostrictively responsive to the magnetic field circumpositionally and superjacently covering the light transmission means about the cross-section of the light transmission means and along a length of the light transmission means for changing the optical path length of the light transmission means along the physical length of the light transmission means in response to the magnetic field, means sensitive to the effect on the light transmission of the light transmission means in response to the magnetic field for measuring the magnetic field, and sensitivity adjusting means comprising a bias magnetic field magnetically coupled to the magnetostrictive means for controllably adjusting the sensitivity of the response of the magnetostrictive means to the magnetic field.

18. A method of controllably adjusting the sensitivity of a magnetic field measurement device comprising the steps of:

providing the magnetic field measuring device having a magnetostrictive means magnetostrictively responsive to the magnetic field circumpositionally and superjacently covering a light transmission means about the cross-section of the light transmission means and along a length of the light transmission means for changing the optical path length of the light transmission means along the physical length of the light transmission means in response to the magnetic field, and having a means quantitatively sensitive to the effect on the light transmission of the light transmission means in response to the magnetic field for quantitatively measuring the magnetic field, providing a bias magnetic field coupled to the magnetostrictive means for biasing the magnetostrictive means to a desired magnetostrictively responsive sensitivity, and adjusting the bias magnetic field to achieve the desired sensitivity.

* * * * *